United States Patent
Lee et al.

(10) Patent No.: US 10,275,297 B2
(45) Date of Patent: Apr. 30, 2019

(54) GENERATING SOFT READ VALUES WHICH OPTIMIZE DYNAMIC RANGE

(71) Applicant: SK hynix memory solutions inc., San Jose, CA (US)

(72) Inventors: Frederick K. H. Lee, Mountain View, CA (US); Jason Bellorado, San Jose, CA (US); Marcus Marrow, San Jose, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 33 days.

(21) Appl. No.: 14/531,817

(22) Filed: Nov. 3, 2014

(65) Prior Publication Data

US 2015/0052408 A1 Feb. 19, 2015

Related U.S. Application Data

(63) Continuation of application No. 13/764,515, filed on Feb. 11, 2013, now Pat. No. 8,943,386.

(60) Provisional application No. 61/599,723, filed on Feb. 16, 2012.

(51) Int. Cl.
| | |
|---|---|
| G06F 11/07 | (2006.01) |
| H03M 13/45 | (2006.01) |
| G06F 3/06 | (2006.01) |
| H03M 13/39 | (2006.01) |
| H03M 13/11 | (2006.01) |
| H04L 1/00 | (2006.01) |

(52) U.S. Cl.
CPC ........ *G06F 11/076* (2013.01); *G06F 11/0727* (2013.01); *G06F 3/0679* (2013.01); *H03M 13/1111* (2013.01); *H03M 13/3927* (2013.01); *H03M 13/45* (2013.01); *H04L 1/0054* (2013.01)

(58) Field of Classification Search
CPC .. G06F 11/076; G06F 11/0727; G06F 3/0679; H04L 1/0054; H03M 13/1111; H03M 13/45; H03M 13/3927
USPC ....... 365/185.03, 185.09; 714/704, 763, 794, 714/799
See application file for complete search history.

(56) References Cited

U.S. PATENT DOCUMENTS

| | | | | |
|---|---|---|---|---|
| 8,484,539 B1* | 7/2013 | Yeung | | G06F 1/3203 714/755 |
| 2005/0246606 A1* | 11/2005 | Cameron | | H03M 13/1111 714/752 |
| 2009/0282184 A1* | 11/2009 | Dutta | | B05B 11/3098 711/103 |
| 2011/0083060 A1* | 4/2011 | Sakurada | | G11C 11/5642 714/763 |
| 2011/0305082 A1* | 12/2011 | Haratsch | | G11C 7/02 365/185.03 |

(Continued)

*Primary Examiner* — April Y Blair
*Assistant Examiner* — Sazzad Hossain
(74) *Attorney, Agent, or Firm* — IP & T Group LLP

(57) ABSTRACT

A plurality of bins and a plurality of soft read values are stored in a lookup table where those bins that are either a leftmost bin or a rightmost bin correspond to soft read values having a maximum magnitude. Bin identification information is received for a cell in solid state storage. A soft read value is generated for the cell in solid state storage, including by: accessing the lookup table, mapping the received bin identification information to one of the plurality of bins in the lookup table, and selecting the soft read value in the lookup table that corresponds to the bin which is mapped to.

11 Claims, 8 Drawing Sheets

(56) References Cited

U.S. PATENT DOCUMENTS

| | | | |
|---|---|---|---|
| 2011/0317488 A1* | 12/2011 | Tseng | G11C 11/5628 365/185.09 |
| 2012/0008386 A1* | 1/2012 | Chilappagari | G11C 11/5642 365/185.2 |
| 2012/0233521 A1* | 9/2012 | Kwok | H03M 13/2906 714/758 |

* cited by examiner $$LLR(offset) = -\frac{LLR_{max\_mag}}{M} \times (offset + M) + LLR_{max\_mag} \quad \leftarrow 320$$

GENERATING SOFT READ VALUES WHICH OPTIMIZE DYNAMIC RANGE

CROSS REFERENCE TO OTHER APPLICATIONS

This application is a continuation of co-pending U.S. patent application Ser. No. 13/764,515, entitled GENERATING SOFT READ VALUES WHICH OPTIMIZE DYNAMIC RANGE filed Feb. 11, 2013 which is incorporated herein by reference for all purposes, which claims priority to U.S. Provisional Patent Application No. 61/599,723 entitled METHOD FOR COMPUTING LOG-LIKELIHOOD RATIOS (LLRS) FOR HARD-READ NAND DEVICES filed Feb. 16, 2012 which is incorporated herein by reference for all purposes.

BACKGROUND OF THE INVENTION

Solid state storage systems, such as NAND Flash systems, do not natively return soft read values, such as log-likelihood ratio (LLR) values, when read. Although a number of techniques exist to synthesize or generate soft read values for solid state storage devices, new techniques which improve the performance of the system (e.g., as measured by error rate and/or processing cycles or time) would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
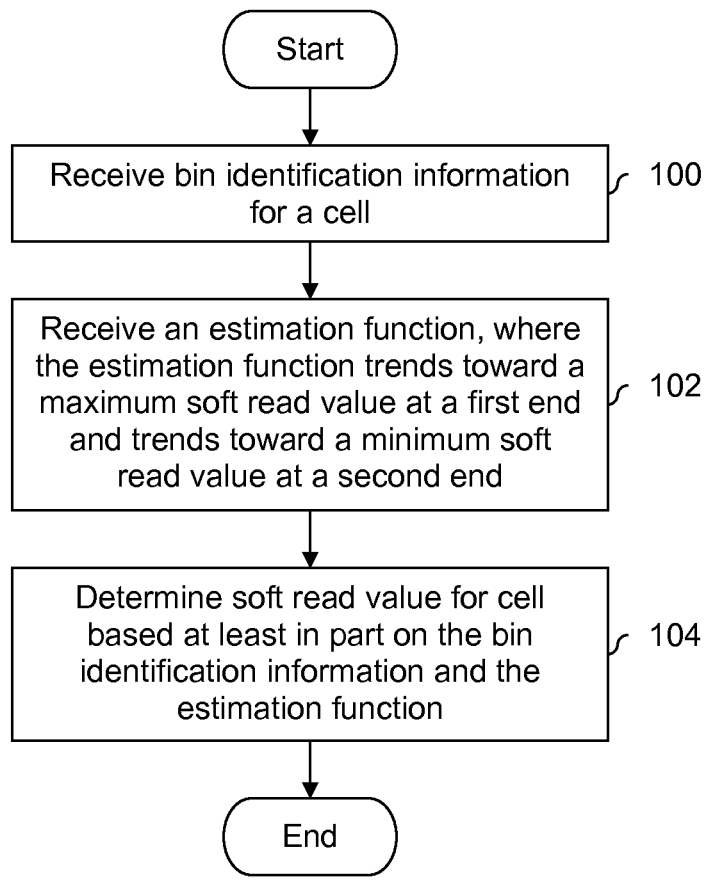
FIG. 1 is a flowchart illustrating an embodiment of a process for generating soft read values that optimize dynamic range.

FIG. 1 is a flowchart illustrating an embodiment of a process for generating soft read values that optimize dynamic range. In the example shown, bin identification information for a cell is received at 100. For example, a group of cells (e.g., a page) in solid state storage (e.g., NAND Flash) may be read one or more times. Depending upon the sequence of returned hard read value(s) for a given cell in the group, each cell falls into one of the bins. In one example, after three reads to a group of single level cells (SLC), cells with a read back sequence of (000) are in a leftmost bin, cells with a read back sequence of (100) are in a second from left bin, cells with a read back sequence of (110) are in a second from right bin, and cells with a read back sequence of (111) are in a rightmost bin. In this example, all other read back sequences are invalid and are assigned a soft read back value accordingly (e.g., an erasure value). In some embodiments, bin identification information received at 100 is a bin number that uniquely identifies a bin. In some embodiments, bin identification information received at 100 include a left bin edge and a right bin edge. In some embodiments, bin edges received at 100 are absolute values. In some embodiments, bin edges received at 100 are relative values (e.g., an offset with respect to an optimal read threshold (estimate) or some other reference voltage). In some embodiments, bin identification information is received from a bin mapper configured to determine what bin a cell falls into.

At 102, an estimation function is received, where the estimation function trends toward a maximum soft read value at a first end and trends toward a minimum soft read value at a second end. Some examples of estimation functions include linear functions, non-linear functions (e.g., second order or higher polynomials), and functions which cannot be expressed in closed form. Various examples of estimation functions are described in further detail below.

A soft read value for a cell is determined based at least in part on the bin identification information and estimation function at 104. The soft read values generated are configured to optimize the dynamic range of however many bits are used to represent the soft read values; this improves the performance of a downstream error correction decoder which the soft read values are passed to. For example, if 4 bits are used to represent an LLR (one embodiment of soft read values), then the LLR values generated will utilize the entire dynamic range of the 4 bits. In some embodiments, this includes ensuring that clipping or saturation does not occur. Generated LLR values would not be clustered around the larger magnitudes (e.g., around |7| or |6| in a 4-bit LLR system) with relatively few LLR values generated with lower magnitudes (e.g., |2|, |1|, or 0 in a 4-bit LLR system). Conversely, usage of an estimation function having the described properties also helps to ensure that the LLR values do not cluster around the smaller magnitudes, which effectively reduces the number of bits used to represent an LLR or other soft read value. Some of the bits allocated to represent the LLR are "wasted." Using an estimation function (where the estimation function trends toward a maximum soft read value at one end and toward a minimum soft read value at the other end) ensures that the dynamic range of the LLR (represented in however many bits) is used in an optimal manner.

In some embodiments, the leftmost and rightmost bins (at least in a single-level cell (SLC) system) are assigned a highest and lowest (or vice versa) soft read value. In one example, 4-bit LLRs are used (i.e., one bit for the sign and 3 bits for the magnitude) and an LLR value of +7 (i.e., a maximum soft read value) is output for a leftmost bin and an LLR value of −7 is output for the rightmost bin.

Figure 2:
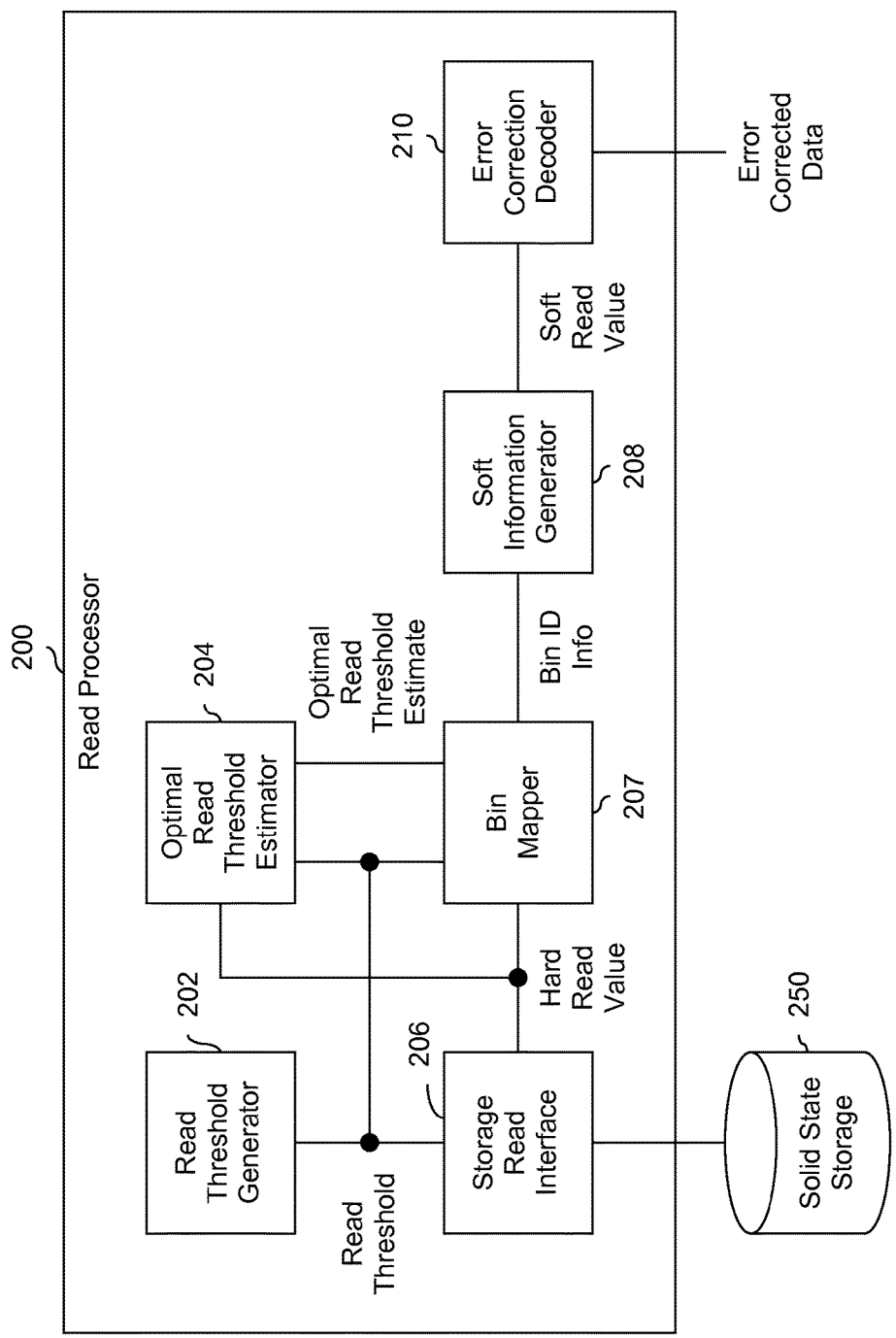
FIG. 2 is a diagram showing an embodiment of a read processor configured to generate soft read values that optimize dynamic range.

FIG. 2 is a diagram showing an embodiment of a read processor configured to generate soft read values that optimize dynamic range. In some embodiments, soft information generator 208 performs the example process shown in FIG. 1. In some embodiments, read processor 200 is implemented using a semiconductor device, such as an application-specific integrated circuit (ASIC) or a field-programmable gate array (FPGA). For clarity, FIG. 2 does not show a write processor (sometimes referred to as a write path) but this is not intended to be limiting. Systems which implement the techniques described herein do not necessarily exclude components which are not shown in FIG. 2 (such as write processors or write paths).

Read threshold generator 202 generates a read threshold which is passed to storage read interface 206. Storage read interface 206 performs a read of solid state storage 250 using the read threshold and outputs a hard read value (e.g., a 0 or 1 in a SLC system) based on the stored voltage and the read threshold. In one example, solid state storage 250 is NAND Flash storage. Solid state storage systems do not natively return soft read values and so soft read values are synthesized by soft information generator 208. In this example, error correction decoder 210 is a soft-input decoder which is expecting to receive soft read values. In some embodiments, error correction decoder 210 is a soft-input, low-density parity-check (LDPC) error correction decoder.

Bin mapper 207 generates bin identification information using the read threshold, the hard read value, and the optimal read threshold estimate ($\hat{x}_{opt}$). The optimal read threshold estimate is generated by optimal read threshold estimator 204 using the read threshold and hard read value and is an estimate of an optimal read threshold where one distribution (e.g., a distribution of all cells written with a 1) crosses another distribution (e.g., a distribution of all cells written with a 0). In some embodiments, the bin identification information generated by bin mapper 207 includes a left bin edge and a right bin edge, where the edges are offsets with respect to the optimal read threshold estimate.

Soft information generator 208 receives the bin identification information and generates a soft read value. For example, soft information generator 208 may perform the process of FIG. 1. Some other embodiments for generating soft read values are described in further detail below.

The soft read value generated by soft information generator 208 is passed to error correction decoder 210. If error correction decoding is successful, corrected data is output. If not, another iteration or attempt is performed. For example, read threshold generator 202 outputs a new read threshold, another read is performed by storage read interface 206 using the new read threshold, and so on. In some embodiments, bin mapper 207, soft information generator 208 and/or optimal read threshold estimator 204 saves previous read thresholds and/or previous hard read values.

Although this example and other examples describe a single level cell (SLC) system, these examples are not intended to be limiting. In some other embodiments, the techniques described herein are used in with a multi-level cell (MLC) system.

Figure 3:
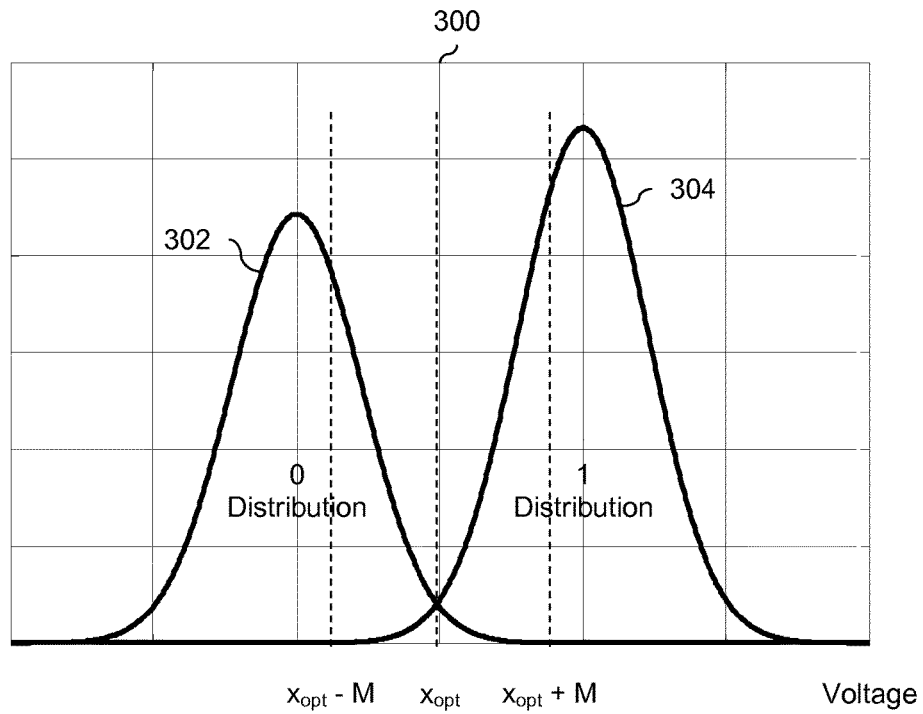
FIG. 3 is a diagram showing an embodiment of a linear estimation function.
Figure 3:
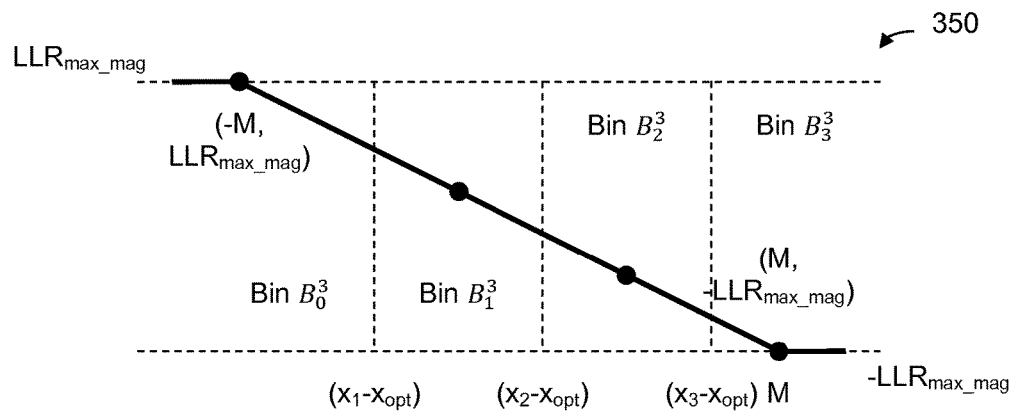

FIG. 3 is a diagram showing an embodiment of a linear estimation function. In the example shown, diagram 300 includes voltage distributions 302 and 304 (e.g., the y-axis of diagram 300 is number of cells as is the case with a histogram or percentage as is the case with a probability distribution function). Distribution 302 is associated with all cells in a group (e.g., a page) which were written with a 0; distribution 304 is associated with all cells in that same group which were written with a 1. These distributions are typically not known to a read processor but are shown in order to explain the technique. The crossing point of distributions 302 and 304 is the optimal read threshold ($x_{opt}$). Optimal read threshold estimator 204 in FIG. 2 generates an estimate of this crossing point (i.e., $\hat{x}_{opt}$; where the "hat" indicates it is an estimate) of the actual read optimal threshold (i.e., $x_{opt}$, without a "hat") shown in diagram 300.

A window around the optimal read threshold (i.e., the range $[(x_{opt}-M), (x_{opt}+M)]$) is determined or selected and over this range an estimation function (in this example, a linear estimation function) is used to generate soft read values. Looking at diagram 350, this corresponds to a line drawn between the point (offset=−M, LLR=$LLR_{max\_mag}$) and the point (offset=M, LLR=$-LLR_{max\_mag}$). For example, if a 4-bit LLR is used, $LLR_{max\_mag}$=7 and $-LLR_{max\_mag}$=−7.

This line between (offset=−M, LLR=$LLR_{max\_mag}$) and (offset=M, LLR=$-LLR_{max\_mag}$) is given by equation 320. Note that the input to equation 320 is an offset with respect to the optimal read threshold (i.e., $x_{opt}$) or an estimate thereof (i.e., $\hat{x}_{opt}$).

In diagram 350, three reads have been performed and the read thresholds associated with those reads define the bin edges of the four bins. When converted to offsets, the bin edges are at ($x_1-x_{opt}$), ($x_2-x_{opt}$), and ($x_3-x_{opt}$). Depending upon the hard read values returned for a given cell, each of the cells is assigned to one of bins $B_0^3$, $B_1^3$, $B_2^3$, or $B_3^3$. In this example, the cells in the leftmost bin (i.e., bin $B_0^3$) are assigned the maximum soft read value (e.g., $LLR_{max\_mag}$) and cells in the rightmost bin (i.e., bin $B_3^3$) are assigned the minimum soft read value (e.g., $-LLR_{max\_mag}$). Cells in bins $B_1^3$ and $B_2^3$ are assigned an LLR using equation 320 where the offset which is input to equation 320 is the center of a given bin.

It should be noted that that the read thresholds $x_1$, $x_2$, and $x_3$ are in sorted order (e.g., from small to large) and does not necessarily reflect the sequence of reads. That is, the reads are not necessarily performed in the order: read at $x_1$, then $x_2$, and then $x_3$. Also, this particular example assumes that lower voltages are associated with a stored 0 and higher voltages are associated with a stored 1; other systems may have different assigned values and the estimation function changes accordingly (e.g., slope is positive instead of negative).

The value of M may be obtained in a variety of ways. In some embodiments, M is a programmable value. In some embodiments, M is determined ahead of time (e.g., during design of the system) using simulations.

In the event error correction decoding fails, another read is performed and the set of bins $B_0^3$, $B_1^3$, $B_2^3$, and $B_3^3$ becomes the set of bins $B_0^4$, $B_1^4$, $B_2^4$, $B_3^4$, and $B_4^4$ (not shown). In this particular example, cells in bins $B_0^4$ and $B_4^4$ would be assigned LLR values of $LLR_{max\_mag}$ and $-LLR_{max\_mag}$, respectively, and LLR values obtained from equation 320 would be assigned to cells in bins $B_1^4$, $B_2^4$, and $B_3^4$. In some embodiments, an optimal read threshold estimate changes with each iteration and offsets are adjusted as or if needed.

One benefit to having an offset as the input to equation 320 is that the same function can be used, even as the estimate of an optimal read threshold changes. Many systems generate an updated or new optimal read threshold estimate with each iteration or attempt. Since equation 320 takes an offset as input, only a single equation needs to be stored since equation 320 will never be "out of range" or "off center" no matter how much an optimal read threshold estimate changes or deviates from an expected range. In contrast, if equation 320 did not take an offset as its input, a plurality of equations would need to be stored and the appropriate equation which is best "centered" around the current optimal read threshold estimate would need to be selected. This would require more storage which is undesirable.

In some embodiments, the technique described herein generates soft read values which do not vary with program erase cycles and/or the age of the data. The following figures show some embodiments of this and why such a configuration might be desirable in some applications.

Figure 4A:
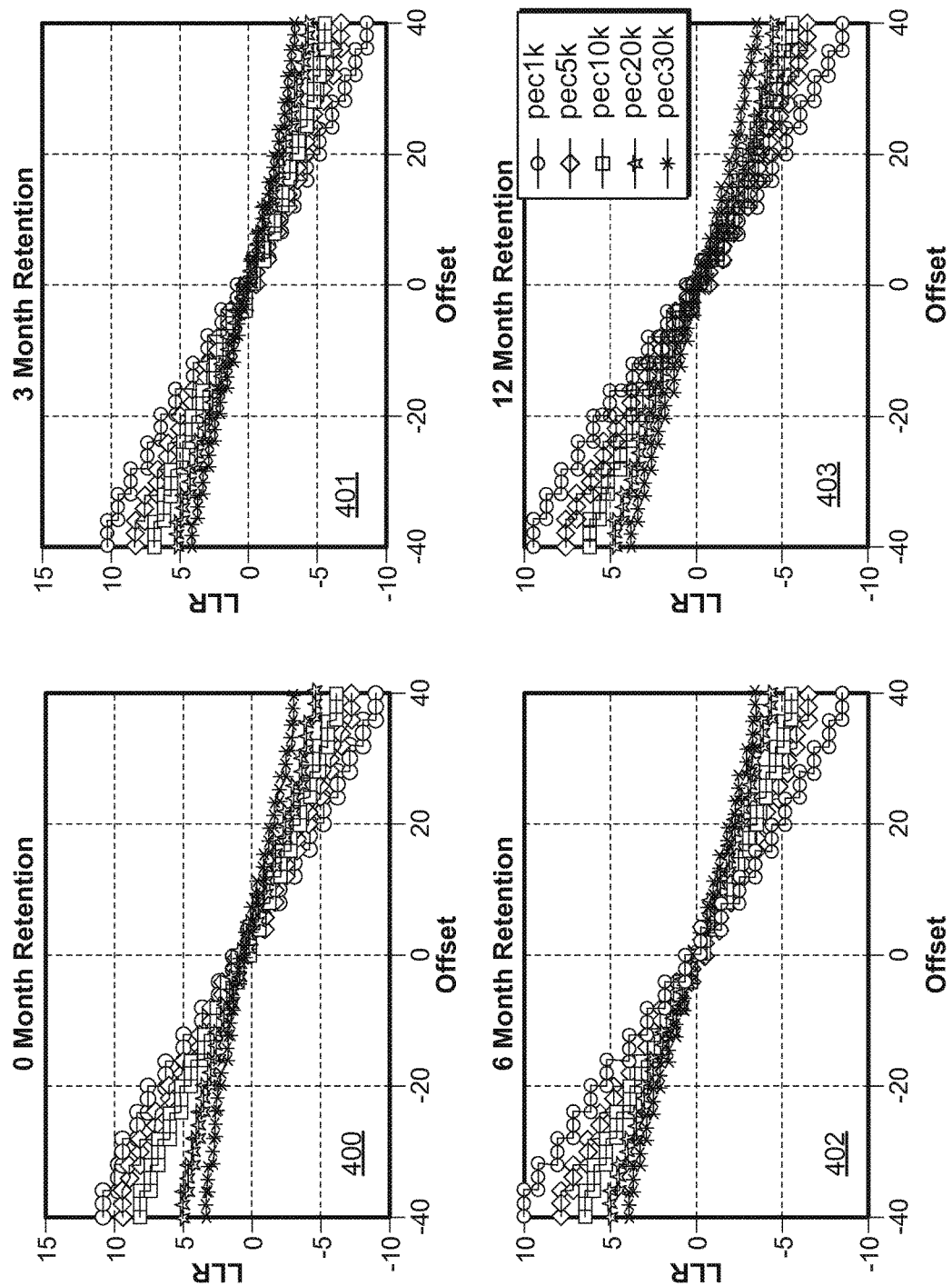
FIG. 4A is a diagram showing an example of another system where generated LLR values vary based upon program erase cycles (PEC) and the age of data.

FIG. 4A is a diagram showing an example of another system where generated LLR values vary based upon program erase cycles (PEC) and the age of data. Diagram 400 shows LLR values for data which is 0 months old, diagram 401 shows LLR values for data which is 3 months old, diagram 402 shows LLR values for data which is 6 months old, and diagram 403 shows LLR values for data which is 12 months old. In this particular example, within each diagram, different LLR values correspond to different numbers of program erase cycles experienced by the storage. In general, as the number of program erase cycles increases, the magnitudes of LLR values in diagrams 400-403 decrease.

Some other systems attempt to generate soft read values which model those shown in diagrams 400-403. In other words, these systems generate LLR values which vary based upon a number of program erase cycles (PEC) and/or the age of stored data as shown in diagrams 400-403. For example, some other systems may store PEC count and/or retention time of the stored data (i.e., the age of the stored data) for each block of cells such that an appropriate lookup table or linear function may be selected for a given page or other group of cells.

A first drawback of such a technique is that the dynamic range of the soft read value is not fully utilized for some data retention values and/or PEC values. For example, although the LLR values in diagrams 400-403 range in magnitude from 0 to 15, for PEC values of 30 k, the largest magnitude of LLR value output is less than |5| for all of graphs 400-403. This effectively reduces a 5-bit LLR to a 4-bit LLR since the most significant magnitude bit is never utilized. It would be desirable to use the entire dynamic range of however many bits are allocated to represent an LLR or other soft read value.

Another drawback to this technique is that it requires a significant amount of storage. For example, all of the functions shown in diagrams 400-403 must be stored. Also, in order to know which is the appropriate function to select, the system must track the number of PEC for each block of cells, as well as the age of data in each block. This requires a significant amount of memory and possibly new hardware to track this information, both of which are undesirable. Furthermore, it may be difficult or impossible to track the age of the data when a storage device is powered down (e.g., because there is no clock is available to a controller).

In some embodiments, a single (e.g., LLR) estimation function or a single (e.g., LLR) lookup table is used regardless of the number of program erase cycles (PEC) and/or the age of data. Put another way, in some embodiments, the LLR values generated do not change with PEC count and/or data age. The following figure shows one example of this.

Figure 4B:
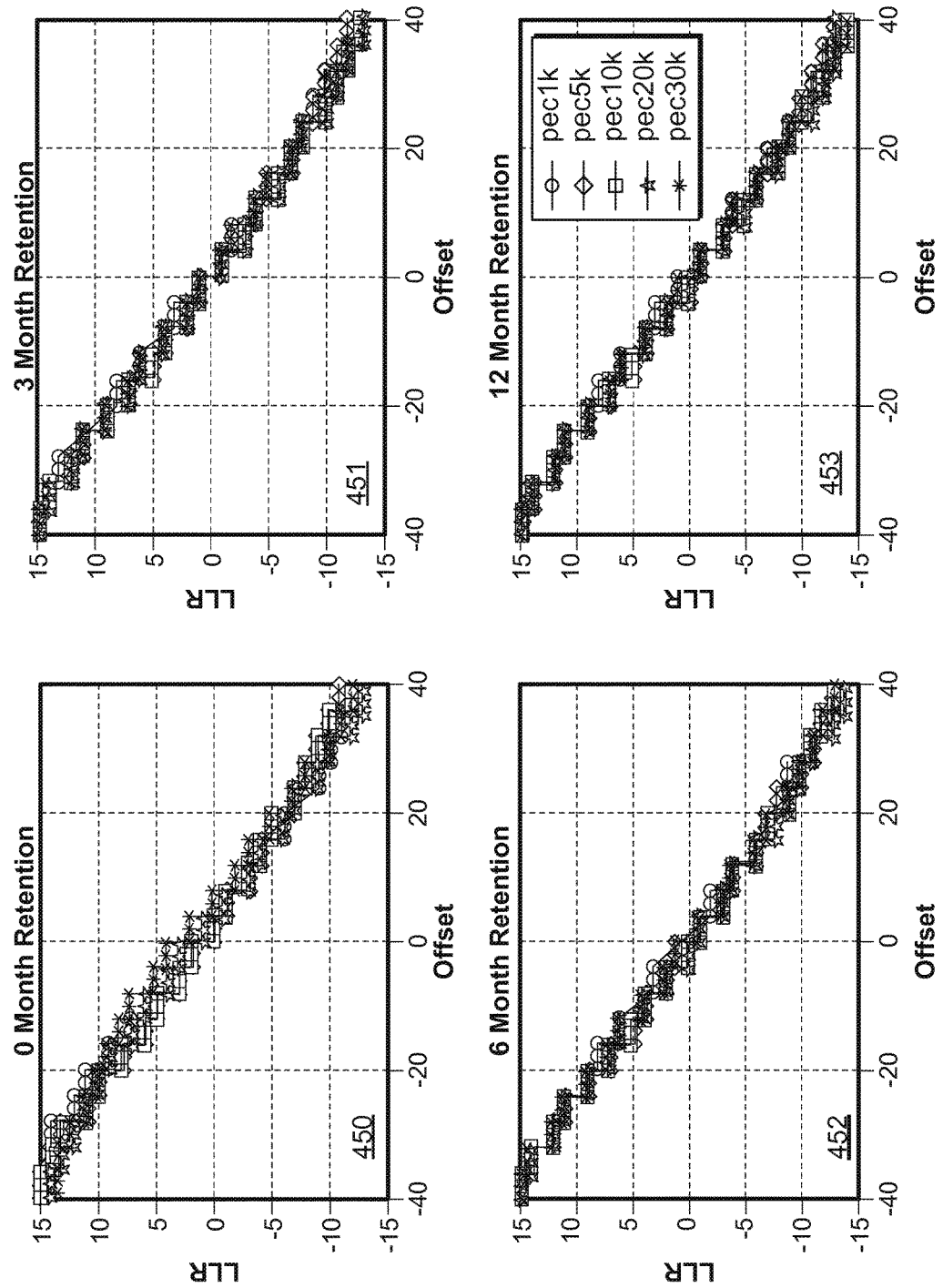
FIG. 4B is a diagram showing an embodiment of generated LLR values which do not vary with program erase cycles (PEC) or the age of data.

FIG. 4B is a diagram showing an embodiment of generated LLR values which do not vary with program erase cycles (PEC) or the age of data. In the example shown, diagrams 450-453 correspond respectively to 0 month old, 3 month old, 6 month old, and 12 month old data. Each of diagrams 400-403 shows LLR values for various PEC values. The LLR values shown in diagrams 450-453 are substantially the same and do not vary significantly with PEC or data retention. This corresponds to using the same LLR estimation function or same LLR lookup table, regardless of PEC count or the age of the data. As will be shown below, a downstream LDPC decoder will have the same performance or better with the LLRs in FIG. 4B as in FIG. 4A but with fewer storage requirements and/or without having to track data retention and/or PEC.

It can be shown (e.g., by scaling the inputs) that LDPC decoders and some other soft input decoders are invariant to scaling of the input. Min-sum decoding, for example, is invariant to scaling, whereas sum-product decoding is not. For decoding processes (such as LDPC decoding) which have this scaling-invariance property, the input to the decoder may be scaled by any constant scaling factor and the decoder will produce equivalent results. Thus, using a same or single estimation function (e.g., regardless of the PEC and/or data retention) produces the same results as a system which selects an estimation function from a plurality of estimation functions based on PEC and/or data retention, but with benefits not offered by other techniques (e.g., less storage, don't have to track PEC count or data age, etc.). Note that this scaling property holds even if the inputs (e.g., LLRs) are generating using a non-linear estimation function.

Another benefit to using a single estimation function (or single lookup table) for all ages of data and/or all PEC values as is shown in FIG. 4B is that it makes full use of the 5-bit LLR. Compare, for example, the LLR values for a PEC count of 30 k in FIG. 4A versus FIG. 4B. The LLR magnitudes for PEC count of 30 k in FIG. 4A never go beyond |5|, which is equivalent to a downstream LDPC decoder receiving a 4-bit LLR even though 5 bits are available or allocated. In contrast, an LDPC decoder which receives the LLR values shown in FIG. 4B receives all 5 bits of the LLR.

Although the examples described above use linear estimation functions, any type of function may be used. The following figure shows some non-linear examples.

Figure 5:
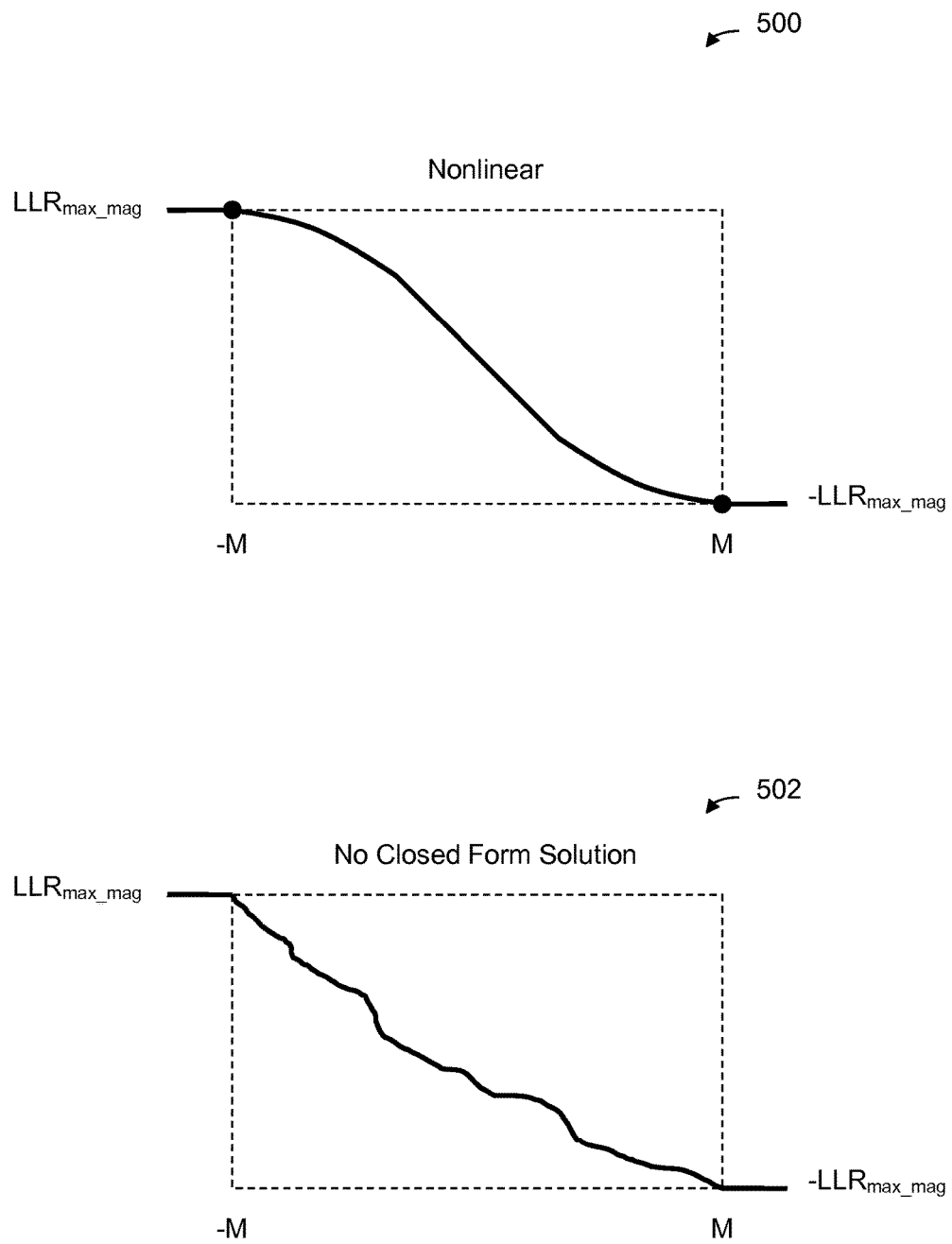
FIG. 5 is a diagram showing an embodiment of non-linear estimation functions.

FIG. 5 is a diagram showing an embodiment of non-linear estimation functions. In the example shown, diagram 500 shows a nonlinear estimation function (e.g., a shifted arccotangent or a negative hyperbolic tangent) and diagram 502 shows a non-closed-form estimation function. In both cases, the left side of the function trends towards $LLR_{max\_mag}$ as an offset of −M is approached and the right side of the function trends toward −$LLR_{max\_mag}$ as an offset of M is approached. As is shown in this example, in some embodiments, nonlinear and/or non-closed-form estimation functions are used.

In some embodiments, lookup tables are used to obtain soft read values as opposed to calculating a value in real time using an equation or function. For example, a lookup table may be populated using the linear estimation function shown in FIG. 3 or the functions shown in FIG. 5. The following figures show an example of a lookup table and an example of how such a lookup table is used.

Figure 6:
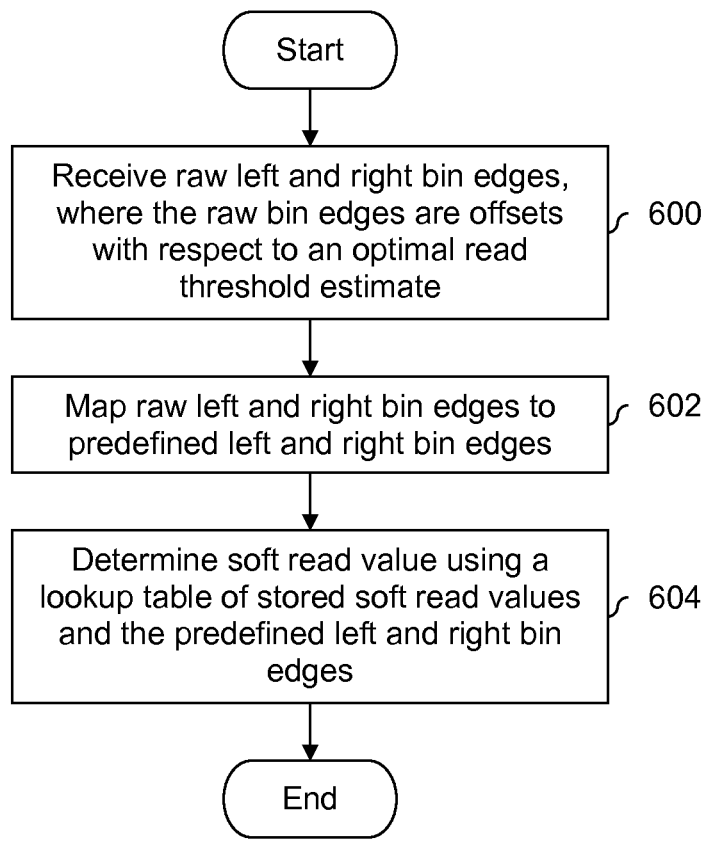
FIG. 6 is a flowchart illustrating an embodiment of a process for using a lookup table to determine a soft read value.

FIG. 6 is a flowchart illustrating an embodiment of a process for using a lookup table to determine a soft read value. At 600, raw left and right bin edges are received, where the raw bin edges are offsets with respect to an optimal read threshold estimate. For example, raw bin edges [−3.2, 1] are received where the raw left bin edge is 3.2 volts to the left of a (current) optimal read threshold estimate and the raw right bin edge is 1 volt to the right of the (current) optimal read threshold estimate. In some embodiments, step 600 is performed by bin mapper 207 in FIG. 2.

At 602, the raw left and right bin edges are mapped to predefined left and right bin edges. For example, there may be predefined bin edges at a certain step size. If the step size is 4 then there are exemplary predefined bin edges at $$\left(-\left\lfloor\frac{M}{4}\right\rfloor\times 4\right),\ldots,-8,-4,0,4,8,\ldots,$$

$$\left(-\left\lfloor\frac{M}{4}\right\rfloor\times 4\right).$$

To continue the example from above, the raw bid edges of [−3.2, 1] are rounded to [−4, 0] for a step size of 4. In some embodiments, step 602 is performed by bin mapper 207 in FIG. 2. In some embodiments, step 602 is performed by soft information generator 208 in FIG. 2 (e.g., bin mapper 207 outputs raw bin edges and soft information generator 208 handles mapping to the nearest predefined bin edge). In some embodiments, mapping at 602 ensures that a bin does not collapse to a width of 0.

At 604, a soft read value is determined using a lookup table of stored soft read values and the predefined left and right bin edges. For example, a lookup table may have stored soft read values for a variety of combinations of predefined bin edges. For example, if M=16 and step size=4: (−16, −12), (−16, −8), (−16, −4), . . . , (8, 12), (8, 16), and (12, 16). For each predefined bin edge combination, a soft read value is stored. To continue the example above, a lookup table of stored soft read values would be accessed to obtain a soft read value for the bin having edges at [−4, 0].

Figure 7:
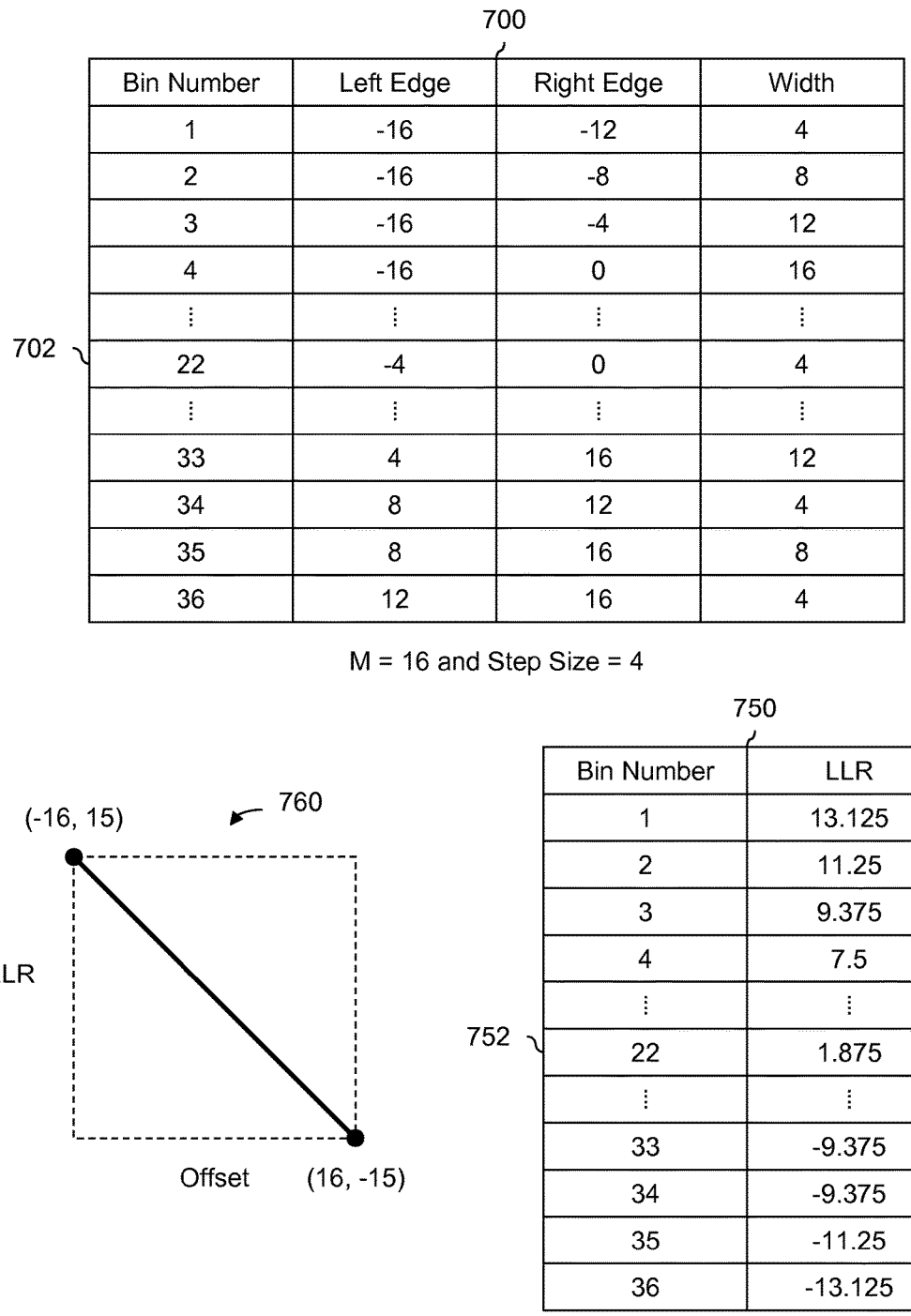
FIG. 7 is a diagram showing an embodiment of a lookup table of soft read values.

FIG. 7 is a diagram showing an embodiment of a lookup table of soft read values. For clarity, the lookup table is broken into two parts: edge table 700 (which includes bin numbers, predefined edge combinations, and widths) and LLR table 750 (which includes bin numbers and LLR values). This division is merely to explain the technique and is not intended to be limiting. In various embodiments, information is organized as desired (e.g., all of the information is contained in a single table). In this example, edge table 700 is populated with an M=16 and a step size of 4.

Using the example from above where raw bin edges [−3.2, 1] are mapped to [−4, 0], edge table 700 is accessed to determine the bin number of the bin with edges at [−4, 0]. Note that the bin edges in edge table 700 are offsets, so table 700 works with any optimal read threshold estimate (e.g., even if the optimal read threshold estimate changes with each iteration and/or if the optimal read threshold estimate deviates significantly from an expected or typical range).

Using the bin number obtained from edge table 700 (in this example, bin number 22, obtained from row 702), the stored LLR corresponding to the bin number is obtained from LLR table 750. Diagram 760 shows the linear estimation function used to populate LLR table 750 with stored LLR values. In this example, a 5-bit LLR is used and so the maximum LLR value is 15 and the minimum LLR value is −15. M=16 so the linear estimation function passes through the points (offset=−16, LLR=15) and (offset=16, LLR=−15). The center of each bin is used to calculate the LLR value stored in LLR table 750 using the linear estimation function shown in diagram 760. To clearly illustrate the technique, LLR table 750 shows exact LLR values (i.e., regardless of how many bits would actually be required to represent that particular value). In a real system, an LLR value may be rounded in order to fit however many bits are allocated for LLR values (e.g., a 5-bit LLR representation). Row 752 shows that the stored LLR value for bin number 22 is 1.875. As described above, information is organized in a variety of ways in various embodiments and tables 700 and 750 may be combined if so desired.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus of a memory system, comprising:
a solid state storage including groups of cells; and
a read processor coupled with the solid state storage, wherein the read processor includes an interface in communication with the solid state storage and configured to output hard read values, and an error correction decoder configured to receive a plurality of soft read values of the groups of cells;
a single lookup table configured to store a plurality of bins and the plurality of soft read values, wherein the plurality of bins includes either a leftmost bin or a rightmost bin which correspond to soft read values having a maximum magnitude, and at least one of the groups of cells falls into one of the plurality of bins; and
a soft information generator, for generating soft read values that optimize dynamic range of bits representing the soft read values, the soft information generator in communication with the error correction decoder and configured to:
receive, for a cell in solid state storage, bin identification information being generated using an optimal read threshold estimate and including raw bin edge values, wherein the optimal read threshold estimate is based on a stored single equation with at least an offset as input;
generate a soft read value for the cell in solid state storage, by:
accessing the single lookup table;

mapping the received bin identification information to predefined bin edges of the plurality of bins in the single lookup table using the raw bin edge values;

locating a plurality of mapped bins according to the single lookup table;

calculating log-likelihood ratio (LLR) values at least partially based on offsets, the offsets are the centers of the plurality of mapped bins and inputs of an estimation function of $$LLR(\text{offset}) = -\frac{LLR_{max\_mag}}{M} \times (\text{offset} + M) + LLR_{max\_mag},$$

wherein $LLR_{max\_mag}$ is a maximum magnitude value of the LLR, and M is distance from an optimal read threshold, and wherein the calculated LLR values do not vary with program erase cycles and age of stored data;

assigning the LLR values to the plurality of mapped bins, wherein the LLR values do not cluster around smaller magnitudes, the number of bits representing the LLR values is minimized, and the range of the LLR values is dynamic and optimal; and selecting the soft read values in the single lookup table that correspond to the plurality of mapped bins to which the soft read values are assigned; and output the generated soft read value to the error correction decoder.

2. The apparatus of claim 1, wherein the plurality of bins in the single lookup table have different bin widths.

3. The apparatus of claim 1, wherein the raw bin edge values are offsets with respect to the optimal read threshold estimate.

4. The apparatus of claim 1, wherein the system includes a semiconductor device, including one or more of the following: an application-specific integrated circuit (ASIC) or a field-programmable gate array (FPGA).

5. A method of operating a memory system, comprising:

outputting, by an interface of a read processor, hard read values, the interface in communication with a solid state storage;

receiving, by an error correction decoder of the read processor, a plurality of soft read values of groups of cells in the solid state storage;

storing, in a single lookup table, a plurality of bins and the plurality of soft read values, wherein the plurality of bins includes either a leftmost bin or a rightmost bin which correspond to soft read values having a maximum magnitude, and at least one of the groups of cells falls into one of the plurality of bins;

receiving, for a cell in solid state storage, by a soft information generator in communication with the error correction decoder, bin identification information being generated using an optimal read threshold estimate and including raw bin edge values, wherein the optimal read threshold estimate is based on a stored single equation with at least an offset as input and the soft information generator generates soft read values that optimize a dynamic range of bits representing the soft read values;

generating, by the soft information generator, a soft read value for the cell in solid state storage, by:

accessing the single lookup table;

mapping the received bin identification information to predefined bin edges of the plurality of bins in the single lookup table using the raw bin edge values;

locating a plurality of mapped bins according to the single lookup table;

calculating LLR values at least partially based on offsets, the offsets are the centers of the plurality of mapped bins and inputs of an estimation function of $$LLR(\text{offset}) = -\frac{LLR_{max\_mag}}{M} \times (\text{offset} + M) + LLR_{max\_mag},$$

wherein $LLR_{max\_mag}$ is a maximum magnitude value of the LLR, and M is distance from an optimal read threshold, and wherein the calculated LLR values do not vary with program erase cycles and age of stored data;

assigning the LLR values to the plurality of mapped bins, wherein the LLR values do not cluster around smaller magnitudes, the number of bits representing the LLR values is minimized, and the range of the LLR values is dynamic and optimal; and selecting the soft read values in the single lookup table that correspond to the plurality of mapped bins to which the soft read values are assigned; and outputting the generated soft read value to the error correction decoder.

6. The method of claim 5, wherein the plurality of bins in the single lookup table have different bin widths.

7. The method of claim 5, wherein raw bin edge values are offsets with respect to the optimal read threshold estimate.

8. The method of claim 5, wherein the method is performed by a semiconductor device, including one or more of the following: an application-specific integrated circuit (ASIC) or a field-programmable gate array (FPGA).

9. A computer program product, the computer program product being embodied in a non-transitory tangible computer readable storage medium and comprising computer instructions, the computer instructions are executed by a processor and configured to:

receive, by an error correction decoder of the processor, a plurality of soft read values of groups of cells in a solid state storage;

store, in a single lookup table, a plurality of bins and the plurality of soft read values, wherein the plurality of bins include either a leftmost bin or a rightmost bin which correspond to soft read values having a maximum magnitude, and at least one of the groups of cells falls into one of the plurality of bins;

receive, for a cell in solid state storage, by a soft information generator of the processor and in communication with the error correction decoder, bin identification information being generated using an optimal read threshold estimate and including raw bin edge values, wherein the optimal read threshold estimate is based on a stored single equation with at least an offset as input and the soft information generator generates soft read values that optimize a dynamic range of bits representing the soft read values;

generate, using the soft information generator, a soft read value for the cell in solid state storage, by:

accessing the single lookup table;

mapping the received bin identification information to predefined bin edges of the plurality of bins in the single lookup table using the raw bin edge values;

locating a plurality of mapped bins according to the single lookup table;

calculating LLR values at least partially based on offsets, the offsets are the centers of the plurality of mapped bins and inputs of an estimation function of $$LLR(\text{offset}) = -\frac{LLR_{max\_mag}}{M} \times (\text{offset} + M) + LLR_{max\_mag},$$

wherein $LLR_{max\_mag}$ is a maximum magnitude value of the LLR, and M is distance from an optimal read threshold, and wherein the calculated LLR values do not vary with program erase cycles and age of stored data;

assigning the LLR values to the plurality of mapped bins, wherein the LLR values do not cluster around smaller magnitudes, the number of bits representing the LLR values is minimized, and the range of the LLR values is dynamic and optimal; and selecting the soft read values in the single lookup table that correspond to the plurality of mapped bins to which the soft read values are assigned; and output the generated soft read value to the error correction decoder.

10. The computer program product of claim 9, wherein the plurality of bins in the single lookup table have different bin widths.

11. The computer program product of claim 9, wherein the raw bin edge values are offsets with respect to the optimal read threshold estimate.

* * * * *